United States Patent
Lin et al.

(10) Patent No.: US 6,362,045 B1
(45) Date of Patent: Mar. 26, 2002

(54) METHOD TO FORM NON-VOLATILE MEMORY CELLS

(75) Inventors: Yung-Tao Lin; Chwa Siow Lee, both of Singapore (SG); Chiew Sin Ping, Kuala Lumpur (MY)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/567,419

(22) Filed: May 9, 2000

(51) Int. Cl.⁷ .............................................. H01L 21/336
(52) U.S. Cl. ........................ 438/257; 438/262; 438/264
(58) Field of Search ................................. 438/257, 262, 438/264, 528, 593

(56) References Cited

U.S. PATENT DOCUMENTS

| | | | |
|---|---|---|---|
| 5,422,291 A | 6/1995 | Clementi et al. | 437/43 |
| 5,567,638 A | 10/1996 | Lin et al. | 437/46 |
| 5,661,056 A | 8/1997 | Takeuchi | 438/261 |
| 5,972,751 A * | 8/1998 | Ramsbey et al. | 438/257 |
| 5,847,427 A | 12/1998 | Hagiwara | 257/324 |
| 6,127,227 A * | 1/1999 | Lin et al. | 438/261 |

* cited by examiner

Primary Examiner—David Nelms
Assistant Examiner—Renee' R. Berry
(74) Attorney, Agent, or Firm—George O. Saile; Rosemary L. S. Pike

(57) ABSTRACT

A new method of forming non-volatile memory cells with an improved bottom silicon dioxide layer of the O—N—O has been achieved. A semiconductor substrate is provided. A tunneling dielectric layer is grown overlying the semiconductor substrate. A polysilicon layer is deposited overlying the tunneling dielectric layer. Nitrogen is implanted into the polysilicon layer to form a nitridized surface region. The polysilicon layer and the tunneling dielectric layer are then patterned to form floating gates. A bottom silicon dioxide layer is grown overlying the floating gates by thermal oxidation of the polysilicon layer. The nitridized surface region reduces the rate of thermal oxidation and creates a smooth surface. A silicon nitride layer is deposited overlying the bottom silicon dioxide layer. A top silicon dioxide layer is formed overlying the silicon nitride layer to complete the O—N—O stack. A conductive layer, that may comprise polysilicon, is deposited overlying the top silicon dioxide layer. The conductive layer, the top silicon dioxide layer, the silicon nitride layer, and the bottom silicon dioxide layer are patterned to form control gates and to complete the non-volatile memory cells.

20 Claims, 5 Drawing Sheets

METHOD TO FORM NON-VOLATILE MEMORY CELLS

BACKGROUND OF THE INVENTION (1) Field of the Invention

The invention relates to a method of fabricating semiconductor structures, and more particularly, to a method of forming non-volatile memory cells in the manufacture of an integrated circuit device.

(2) Description of the Prior Art

Non-volatile memory cells are an important device type in the art of integrated circuit manufacturing. Non-volatile memory cells, such as flash EEPROMs, are used to hold vital data and programming information in computer systems for a variety of applications. Manufacture of non-volatile memory devices presents unique challenges.

Referring now to FIG. 1, a non-volatile memory cell is illustrated. Many such cells would be formed in a typical non-volatile memory integrated circuit device. A semiconductor substrate 10 is shown with shallow trench isolations (STI) 12 defining the device active area. The defining element of the non-volatile memory cell is the presence of a floating gate 18. A very thin tunneling oxide layer 14 overlies the semiconductor substrate 10. The floating gate 18 is formed overlying the tunneling dielectric 14. The floating gate 22 is comprised of a conductive material, such as doped polysilicon, that is not connected to any other circuit element. A stack of dielectric material, called the interpoly dielectric 22, 26, and 30, overlies the floating gate 18. The interpoly dielectric is typically composed of an oxide-nitride-oxide stack (O—N—O) comprising a bottom silicon dioxide layer 22, a silicon nitride layer 26, and a top silicon dioxide layer 30. Finally, a control gate 34, of conducting material such as polysilicon, overlies the second silicon dioxide layer 30. The topology of the bottom silicon dioxide layer 22 is of particular importance to the subject matter of the present invention.

Referring now to FIG. 2, the processing steps used in the prior art to create the non-volatile memory cell are illustrated. The tunneling oxide layer 14 is formed overlying the semiconductor substrate 10 and STI regions 12. A first polysilicon layer 18 is then deposited overlying the tunneling oxide layer 14. The first polysilicon layer 18 and the tunneling oxide layer 14 are patterned to form the floating gate for the device.

Referring now to FIG. 3, the first layer of the interpoly dielectric is formed. A bottom silicon dioxide layer 22 is grown overlying the floating gate 18 and the STI 12. A thermal oxidation process is used to grow the bottom silicon dioxide layer 22 overlying the polysilicon and silicon material of the floating gate 18 and STI 12, respectively. A problem in the prior art is shown by the formation of a wavy topology 35 in the bottom silicon dioxide layer 22. The wavy topology 35 is due to the rapid and uneven oxidation rate of the polysilicon material of the floating gate 22.

The wavy topology 35 of the prior art process causes charge leakage over the completed O—N—O dielectric and leads to data retention problems. In addition, the rapid and uneven oxidation rate of the polysilicon material makes it difficult to scale down or reduce the thickness of the bottom silicon oxide layer 22. This fact limits the viability of the O—N—O stack in smaller geometry devices.

Several prior art approaches disclose methods to form non-volatile memories and to form dielectric layers. U.S. Pat. No. 5,847,427 to Hagiwara discloses a process to form a non-volatile memory device. An oxidation suppressing layer is formed in an upper surface of the floating gate after the floating gate is defined. The interpoly dielectric (O—N—O) layer is then deposited by a chemical vapor deposition. The oxidation suppressing layer is used to eliminate bird's beak formation on the floating gate during an isolation thermal oxidation that is performed after the interpoly dielectric and control gate are formed. U.S. Pat. No. 5,422,291 to Clementi et al teaches an alternative dielectric for non-volatile memory cells. The O—N—O stack between the floating gate and the control gate is replaced with an RTN-N—O stack. Rapid thermal nitridation (RTN) is used to form a nitridized skin over the floating gate. The RTN process is performed by thermal diffusion. A silicon nitride layer is then deposited. Finally, a thermal oxide is grown. U.S. Pat. No. 5,567,638 to Lin et al discloses a process to form polysilicon resistors. A first polysilicon layer, which may form transistor gates, is exposed to a thermal nitridation process to form a nitridized surface layer. A second polysilicon, from which resistors will be formed, is then deposited. Boron is implanted into the second polysilicon to increase resistivity. The presence of the nitridized layer over the first polysilicon prevents boron diffusion from the second polysilicon. U.S. Pat. No. 5,661,056 to Takeuchi teaches a method to form non-volatile memory cells. The O—N—O dielectric between the floating gate and the control gate is replaced with an N—O—N stack. The first silicon nitride layer overlying the floating gate may be formed by RTN.

SUMMARY OF THE INVENTION

A principal object of the present invention is to provide an effective and very manufacturable method to form non-volatile memory cells in the manufacture of integrated circuits.

A further object of the present invention is to provide a method to improve the smoothness of the bottom silicon dioxide layer of the O—N—O stack by implanting nitrogen into the floating gate polysilicon layer prior to thermal oxidation.

A yet further object of the present invention is to improve the data retention capability of the non-volatile memory cell.

Another yet further object of the present invention is to allow the thickness of the bottom silicon dioxide layer of the O—N—O stack to be reduced.

In accordance with the objects of this invention, a new method of forming non-volatile memory cells with an improved bottom silicon dioxide layer of the O—N—O stack in the manufacture of an integrated circuit device has been achieved. A semiconductor substrate is provided. A tunneling dielectric layer is grown overlying the semiconductor substrate. A polysilicon layer is deposited overlying the tunneling dielectric layer. Ions may be implanted into the polysilicon layer to alter resistivity. Nitrogen is implanted into the polysilicon layer to form a nitridized surface region. The polysilicon layer and the tunneling dielectric layer are then patterned to form floating gates. A bottom silicon dioxide layer is grown overlying the floating gates by thermal oxidation of the polysilicon layer. The nitridized surface region reduces the rate of thermal oxidation and creates a smooth surface.

A silicon nitride layer is deposited overlying the bottom silicon dioxide layer. A top silicon dioxide layer is deposited overlying the silicon nitride layer to complete the O—N—O stack. A conductive layer, that may comprise polysilicon, is deposited overlying the top silicon dioxide layer. The conductive layer, the top silicon dioxide layer, the silicon nitride layer, and the bottom silicon dioxide layer are patterned to form control gates and to complete the non-volatile memory cells in the manufacture of the integrated circuit device.

BRIEF DESCRIPTION OF THE DRAWINGS

In the accompanying drawings forming a material part of this description, there is shown.

DESCRIPTION OF THE PREFERRED EMBODIMENTS

The embodiment discloses the application of the present invention to the formation of non-volatile memory cells in the manufacture of integrated circuit devices. It should be clear to those experienced in the art that the present invention can be applied and extended without deviating from the scope of the present invention.

Figure 1:
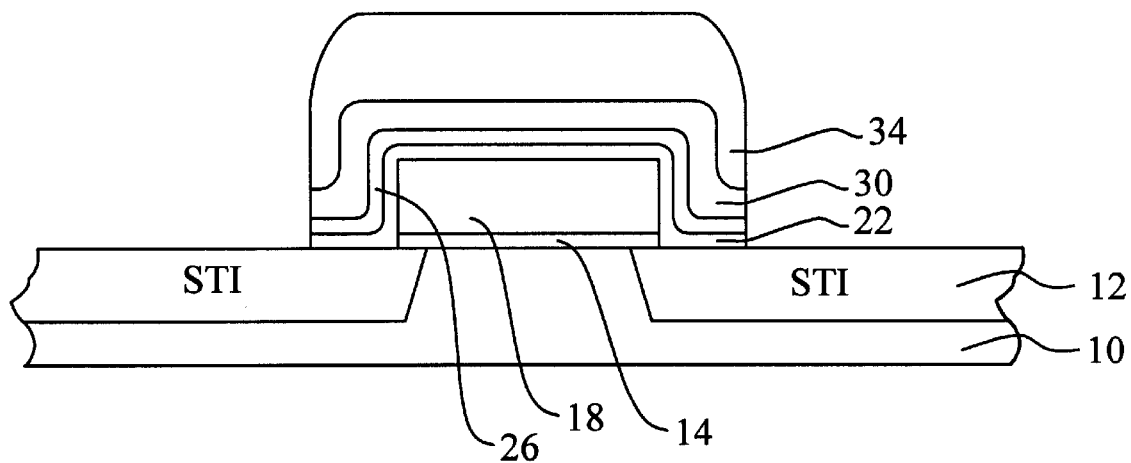
FIGS. 1 through 3 schematically illustrate in cross-section a prior art integrated circuit device.
Figure 2:
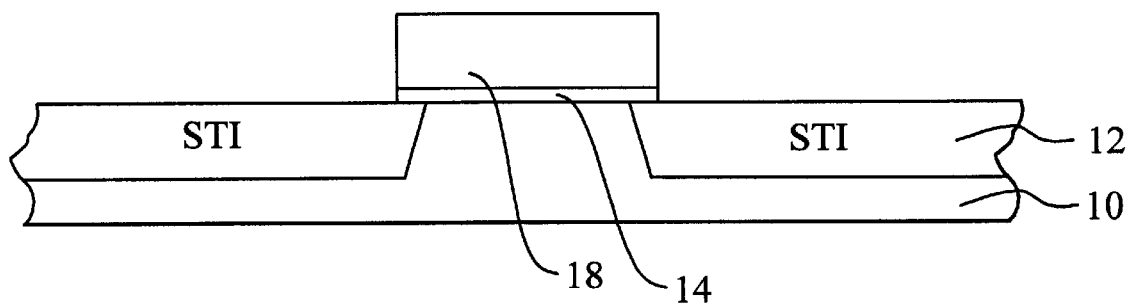
Figure 3:
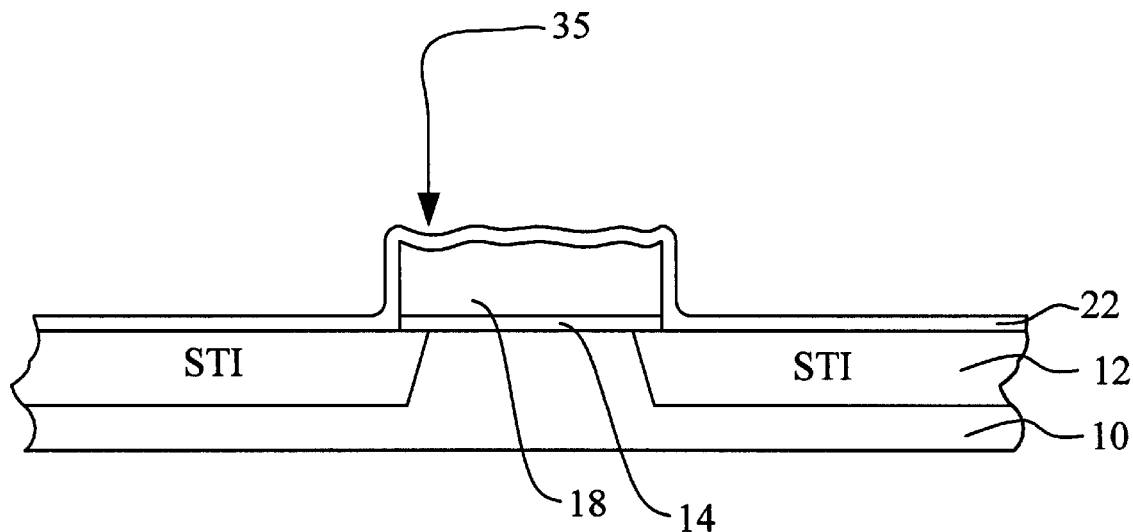
Figure 4:
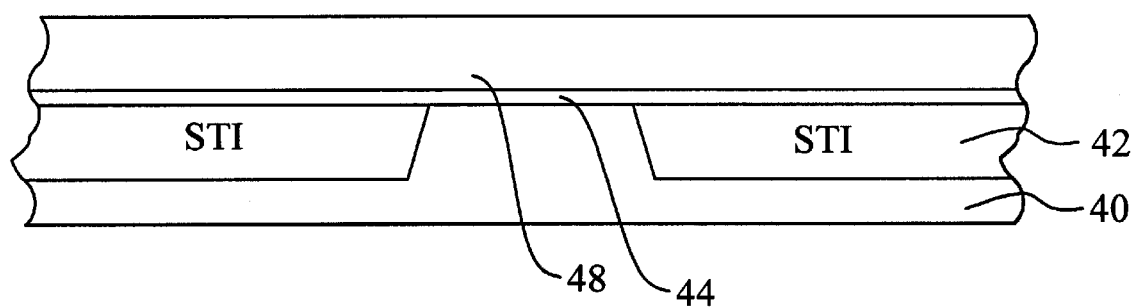
FIGS. 4 through 9 schematically illustrate in cross-sectional representation the preferred embodiment of the present invention.

Referring now particularly to FIG. 4, there is shown a cross-sectional representation of the preferred embodiment of the present invention. A semiconductor substrate 40 is provided. The semiconductor substrate 40 preferably comprises monocrystalline silicon. Shallow trench isolations (STI) 42 are formed in the semiconductor substrate 40 to define the active regions of the integrated circuit device. Alternatively, field oxide regions, formed using a local oxidation of silicon (LOCOS) technique, could be used in place of the STI regions 42.

A tunneling dielectric layer 44 is grown overlying the semiconductor substrate 40. The tunneling dielectric layer 44 is essential to the non-volatile memory cell. The tunneling dielectric layer 44 is made sufficiently thin to allow charging and discharging of the subsequently formed floating gate during a programming or erasing event. The tunneling dielectric layer 44 preferably comprises silicon dioxide grown using a thermal oxidation. The tunneling dielectric layer 44 is preferably grown to a thickness of between about 80 Angstroms and 100 Angstroms.

A polysilicon layer 48 is deposited overlying the tunneling dielectric layer 44. The polysilicon layer 48 will form the floating gate for the memory cell. The polysilicon layer 48 is deposited using, for example, a low-pressure chemical vapor deposition (LPCVD) process. The polysilicon layer 48 is preferably deposited to a thickness of between about 1,000 Angstroms and 1,500 Angstroms.

Figure 5:
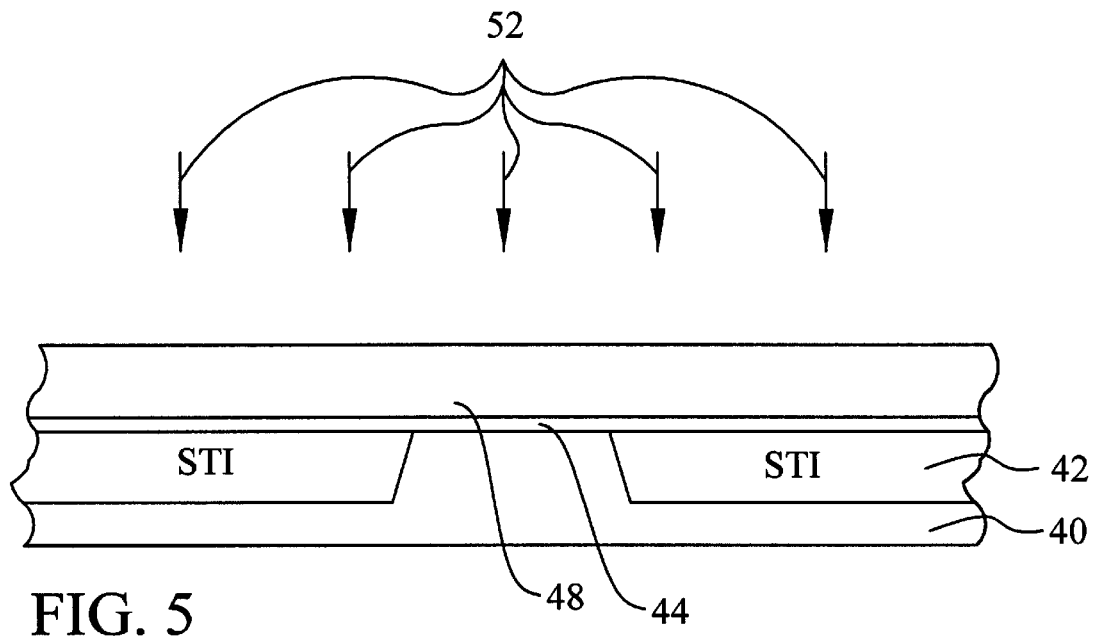

Referring now to FIG. 5, ions are implanted 52 into the polysilicon layer 48 to decrease the resistivity. This step is optional to the key processing embodiments of the present invention. For example, if an insitu doping is performed during the deposition of the polysilicon layer 48, then additional ion implantation would be unnecessary. If performed, however, this implantation step preferably comprises implanting phosphorous at a dose of between about $1\times10^{15}$ atoms/cm$^2$ and $2\times10^{15}$ atoms/cm$^2$ and an energy of between about 10 KeV and 30 KeV. If insitu doping is used, then the polysilicon layer is insitu doped to a resistivity of between about 100 ohm/square and 1,000 ohm/square.

Figure 6:
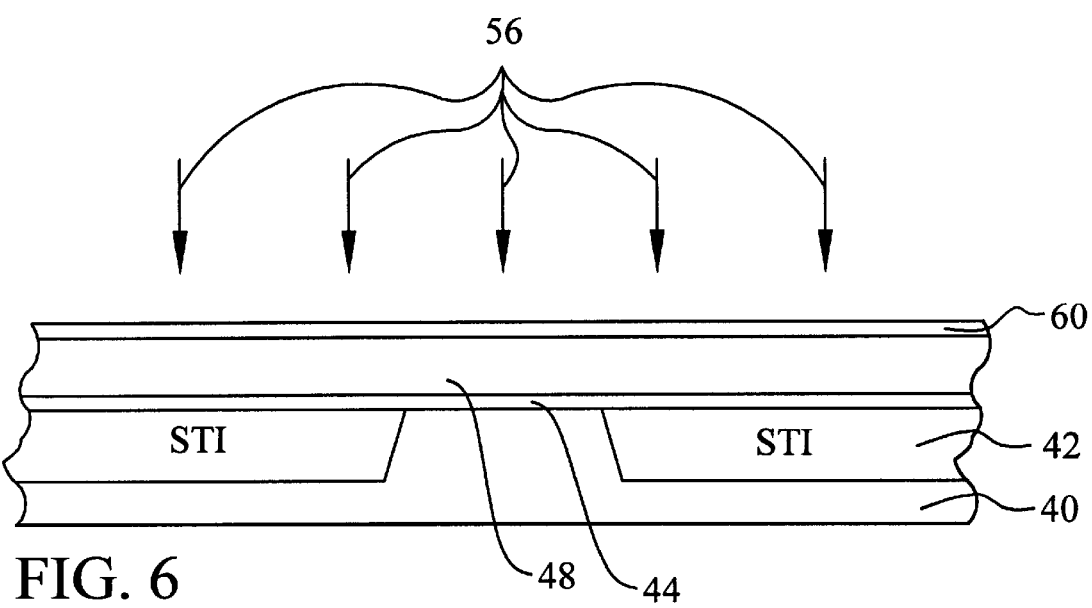

Referring now to FIG. 6, an important step in the method of the present invention is illustrated. Nitrogen ions 56 are implanted into the polysilicon layer 48 to form a nitridize surface region 60. Preferably, this implant step comprises implanting nitrogen at a dose of between about $1\times10^{14}$ atoms/cm$^2$ and $5\times10^{14}$ atoms/cm$^2$ and an energy of between about 5 KeV and 10 KeV. The nitridized surface region 60 has a nitrogen concentration of between about $5\times10^{18}$ atoms/cm$^3$ and $2\times10^{20}$ atoms/cm$^3$ and a depth of between about 100 Angstroms and 300 Angstroms.

The presence of this nitridized surface region 60 in the polysilicon layer 48 alters the oxidation characteristic of the polysilicon layer 48. The oxidation rate of the polysilicon layer 48 is reduced. In the subsequent thermal oxidation of the polysilicon layer 48 to create the bottom oxide layer of the O—N—O stack, the oxide will form more slowly and exhibit improved characteristics.

By implanting nitrogen prior to the definition of the floating gate, a simpler blanket implanting process is possible. It is not necessary in the method of the present invention to suppress oxide growth on the sides of the floating polysilicon.

Figure 7:
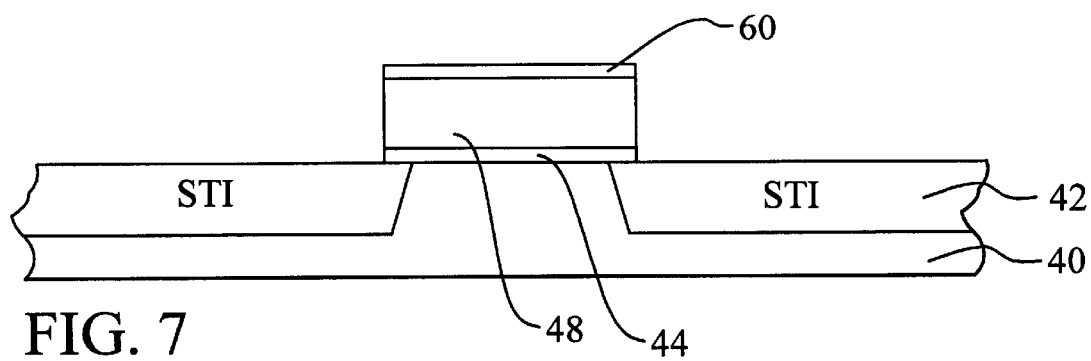

Referring now to FIG. 7, another important feature of the present invention is illustrated. The polysilicon layer 48 and the tunneling dielectric layer 44 are patterned to form the floating gates for the memory cells. Preferably, a conventional photolithographic process is used to form a patterned mask overlying the first polysilicon layer 48. The polysilicon layer 48 and the tunneling dielectric layer 44 are then etched through using a conventional reactive ion etch (RIE). Note that the nitridized surface region 60 overlies the topmost surface of the floating gate 48 and not the sidewalls.

Figure 8:
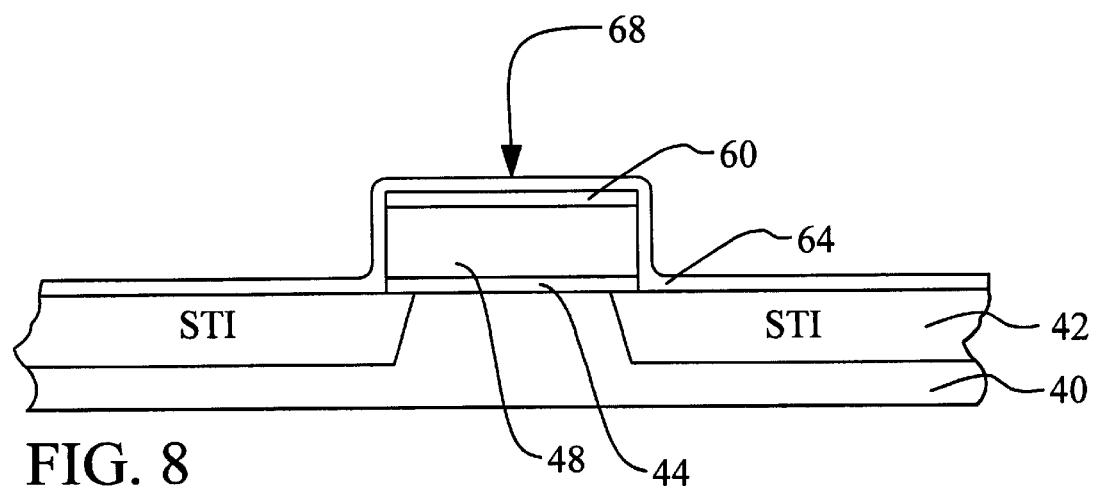

Referring now to FIG. 8, another important feature of the present invention is shown. The bottom silicon dioxide layer 64 is grown overlying the floating gate 48 and the STI 42. A thermal oxidation process is performed to oxidize the polysilicon layer 48 and to thereby form the bottom silicon dioxide layer 64. The presence of the novel nitridized surface region 60 in the topmost surface of the polysilicon layer 48 causes a reduced oxidation rate. The reduction in oxidation rate is essential to the ability of the present invention to create an improved bottom silicon dioxide layer 64. It is found that the presence of the nitridized surface region 60 reduces the silicon dioxide growth rate by about 32%.

The reduced oxidation rate allows the bottom silicon dioxide layer 64 to grow with better uniformity and flatness across the surface of the polysilicon layer 48. The wavy surface of the prior art example is eliminated 68. By improving the surface smoothness of the bottom silicon dioxide layer 64, the data retention capability of the non-volatile memory cell is improved. In addition, the method allows a thinner bottom silicon dioxide layer 64 to be grown while maintaining essential quality and purity. Preferably, the bottom silicon dioxide layer 64 is grown by thermal oxidation to a thickness of between about 80 Angstroms and 100 Angstroms. By comparison, oxide grown overlying a polysilicon layer without the nitridized surface region must be made at least about 120 Angstroms thick to assure quality. By enabling a robust yet thinner bottom silicon dioxide layer 64, the present invention enables the O—N—O based process to be scaled down to smaller dimensions. Finally, by growing the bottom silicon dioxide layer 64 instead of depositing, a better quality oxide is formed.

Figure 9:
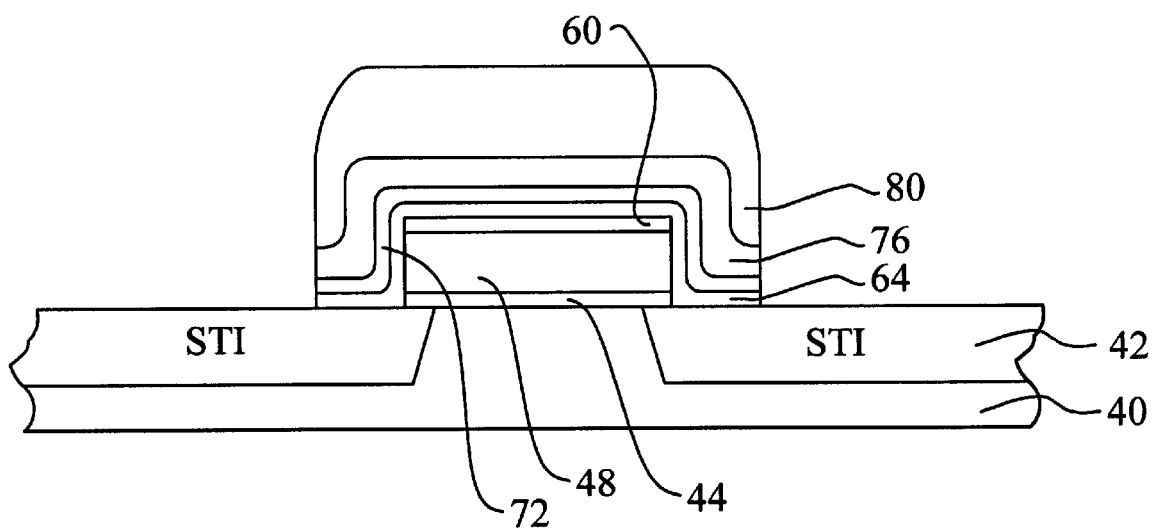

Referring now to FIG. 9, several steps are performed to complete the non-volatile memory cell. First, a silicon nitride layer 72 is deposited overlying the bottom silicon dioxide layer 64. The silicon nitride layer 72 may be deposited using a low-pressure chemical vapor deposition (LPCVD) process. The silicon nitride layer 72 is preferably deposited to a thickness of between about 75 Angstroms and 120 Angstroms.

The top silicon dioxide layer 76 is formed overlying the silicon nitride layer 72. The top silicon dioxide layer is thermally grown to a preferred thickness of between about 30 Angstroms and 60 Angstroms. The O—N—O stack is thereby completed.

A conductive layer 80 is deposited overlying the top silicon dioxide layer 76. The conductive layer 80 preferably comprises polysilicon that may be either doped or undoped. If polysilicon is used, the conductive layer 80 may be deposited by CVD. The conductive layer 80 has a preferred thickness of between about 2,000 Angstroms and 3,000 Angstroms.

The conductive layer 80, the top silicon dioxide layer 76, the silicon nitride layer 72, and the bottom silicon dioxide layer 64 are patterned to form the control gate 80 for the non-volatile memory cell. The patterning process may involve a conventional lithographic sequence comprising: coating, exposing, and developing photoresist; etching through layers; and stripping away photoresist. The formation of the control gate 80 overlying the O—N—O stack and the floating gate 48 completes the non-volatile memory cell in the manufacture of the integrated circuit device.

As shown in the preferred embodiments, the present invention provides a very manufacturable process for forming non-volatile memory cells in an integrated circuit device. A method is achieved to improve the smoothness of the bottom silicon dioxide layer of the O—N—O stack. In addition, a thinner bottom silicon dioxide layer may be grown, thus enabling downward scaling of the memory cell. Nitrogen implantation into the floating gate polysilicon layer forms a novel nitridized surface region that reduces the polysilicon oxidation rate.

While the invention has been particularly shown and described with reference to the preferred embodiments thereof, it will be understood by those skilled in the art that various changes in form and details may be made without departing from the spirit and scope of the invention.

What is claimed is:

1. A method to form non-volatile memory cells in the manufacture of an integrated circuit device comprising:
   providing a semiconductor substrate;
   growing a tunneling oxide layer overlying said semiconductor substrate;
   depositing a polysilicon layer overlying said tunneling oxide layer;
   implanting nitrogen into said polysilicon layer to form a nitridized surface region;
   thereafter patterning said polysilicon layer and said tunneling oxide layer to form floating gates;
   growing a bottom silicon dioxide layer overlying said floating gates where said growing is by thermal oxidation of said polysilicon layer and wherein said nitridized surface region reduces the rate of said thermal oxidation and cause a smooth surface to be grown;
   depositing a silicon nitride layer overlying said bottom silicon dioxide layer;
   forming a top silicon dioxide layer overlying said silicon nitride layer;
   depositing a conductive layer overlying said top silicon dioxide layer; and
   patterning said conductive layer, said top silicon dioxide layer, said silicon nitride layer, and said bottom silicon dioxide layer to form control gates and to complete said non-volatile memory cells in the manufacture of the integrated circuit device.

2. The method according to claim 1 wherein said polysilicon layer is deposited to a thickness of between about 1,000 Angstroms and 1,500 Angstroms.

3. The method according to claim 1 wherein said step of implanting said nitrogen comprises an implantation dose of between about $1\times10^{14}$ atoms/cm$^2$ and $5\times10^{14}$ atoms/cm$^2$ and an energy of between about 5 KeV and 10 KeV.

4. The method according to claim 1 wherein said nitridized surface region is implanted to a concentration of between about $5\times10^{18}$ atoms/cm$^3$ and $2\times10^{20}$ atoms/cm$^3$ and a depth of between about 100 Angstroms and 300 Angstroms.

5. The method according to claim 1 wherein said bottom silicon dioxide layer is grown to a thickness of between about 80 Angstroms and 100 Angstroms.

6. The method according to claim 1 further comprising implanting ions into said polysilicon layer to reduce resistivity after said step of depositing said polysilicon layer and before said step of implanting nitrogen.

7. The method according to claim 6 wherein said step of implanting ions comprises phosphorous implanted with a dose of between about $1\times10^{15}$ atoms/cm$^2$ and $2\times10^{15}$ atoms/cm$^2$ and an energy of between about 10 KeV and 30 KeV.

8. The method according to claim 1 wherein said polysilicon layer is insitu doped to a resistivity of between about 100 ohm/square and 1,000 ohm/square.

9. A method to form non-volatile memory cells in the manufacture of an integrated circuit device comprising:
   providing a semiconductor substrate;
   growing a tunneling oxide layer overlying said semiconductor substrate;
   depositing a first polysilicon layer overlying said tunneling oxide layer;
   implanting nitrogen into said first polysilicon layer to form a nitridized surface region;
   thereafter patterning said first polysilicon layer and said tunneling oxide layer to form floating gates;
   growing a bottom silicon dioxide layer overlying said floating gates where said growing is by thermal oxidation of said first polysilicon layer and wherein said nitridized surface region reduces the rate of said thermal oxidation and causes a smooth surface to be grown;
   depositing a silicon nitride layer overlying said bottom silicon dioxide layer;
   forming a top silicon dioxide layer overlying said silicon nitride layer;
   depositing a second polysilicon layer overlying said top silicon dioxide layer; and
   patterning said second polysilicon layer, said top silicon dioxide layer, said silicon nitride layer, and said bottom silicon dioxide layer to form control gates and to complete said non-volatile memory cells in the manufacture of the integrated circuit device.

10. The method according to claim 9 wherein said first polysilicon layer is deposited to a thickness of between about 1,000 Angstroms and 1,500 Angstroms.

11. The method according to claim 9 wherein said step of implanting said nitrogen comprises an implantation dose of between about $1\times10^{14}$ atoms/cm$^2$ and $5\times10^{14}$ atoms/cm$^2$ and an energy of between about 5 KeV and 10 KeV.

12. The method according to claim 9 wherein said nitridized surface region is implanted to a concentration of between about $5\times10^{18}$ atoms/cm$^3$ and $2\times10^{20}$ atoms/cm$^3$ and a depth of between about 100 Angstroms and 300 Angstroms.

13. The method according to claim 9 wherein said bottom silicon dioxide layer is grown to a thickness of between about 80 Angstroms and 100 Angstroms.

14. The method according to claim 9 further comprising implanting ions into said first polysilicon layer to reduce resistivity after said step of depositing said first polysilicon layer and before said step of implanting nitrogen.

15. The method according to claim 9 wherein said step of implanting ions comprises phosphorous implanted with a dose of between about $1 \times 10^{15}$ atoms /cm$^2$ and $2 \times 10^{15}$ atoms /cm$^2$ and an energy of between about 10 KeV and 30 KeV.

16. A method to form non-volatile memory cells in the manufacture of an integrated circuit device comprising:

providing a semiconductor substrate containing source and drain junctions for planned non-volatile memory cells;

growing a tunneling oxide layer overlying said semiconductor substrate;

depositing a first polysilicon layer overlying said tunneling oxide layer;

implanting ions into said first polysilicon layer to reduce resistivity;

thereafter implanting nitrogen into said first polysilicon layer to form a nitridized surface region;

thereafter patterning said first polysilicon layer and said tunneling oxide layer to form floating gates;

growing a bottom silicon dioxide layer overlying said floating gates where said growing is by thermal oxidation of said first polysilicon layer and wherein said nitridized surface region reduces the rate of said thermal oxidation and cause a smooth surface to be grown;

depositing a silicon nitride layer overlying said bottom silicon dioxide layer;

growing a top silicon dioxide layer overlying said silicon nitride layer;

depositing a second polysilicon layer overlying said top silicon dioxide layer; and patterning said second polysilicon layer, said top silicon dioxide layer, said silicon nitride layer, and said bottom silicon dioxide layer to form control gates and to complete said non-volatile memory cells in the manufacture of the integrated circuit device.

17. The method according to claim 16 wherein said first polysilicon layer is deposited to a thickness of between about 1,000 Angstroms and 1,500 Angstroms.

18. The method according to claim 16 wherein said step of implanting said nitrogen comprises an implantation dose of between about $1 \times 10^{14}$ atoms/cm$^2$ and $5 \times 10^{14}$ atoms/cm$^2$ and an energy of between about 5 KeV and 10 KeV.

19. The method according to claim 16 wherein said nitridized surface region is implanted to a concentration of between about $5 \times 10^{18}$ atoms/cm$^3$ and $2 \times 10^{20}$ atoms/cm$^3$ and a depth of between about 100 Angstroms and 300 Angstroms.

20. The method according to claim 16 wherein said bottom silicon dioxide layer is grown to a thickness of between about 80 Angstroms and 100 Angstroms.

* * * * *